United States Patent [19]

Bigall et al.

[11] 4,333,159
[45] Jun. 1, 1982

[54] COMBINATION SHIFT REGISTER, COUNTER AND MEMORY DEVICE

[75] Inventors: Klaus D. Bigall, Vaterstetten; Helmut Roesler, Munich, both of Fed. Rep. of Germany

[73] Assignee: Siemens Aktiengesellschaft, Berlin & Munich, Fed. Rep. of Germany

[21] Appl. No.: 90,998

[22] Filed: Nov. 5, 1979

[30] Foreign Application Priority Data

Nov. 22, 1978 [DE] Fed. Rep. of Germany ....... 2850652

[51] Int. Cl.$^3$ ............................................. G06F 13/00
[52] U.S. Cl. ...................................... 364/900; 84/1.01
[58] Field of Search ... 364/200 MS File, 900 MS File; 328/37; 84/1.01

[56] References Cited

U.S. PATENT DOCUMENTS

| | | | |
|---|---|---|---|
| 3,453,551 | 7/1969 | Haberle | 328/37 |
| 3,531,720 | 9/1970 | Norsworthy | 328/37 |
| 3,610,799 | 10/1971 | Watson | 84/1.01 |
| 3,777,278 | 12/1973 | Majeau et al. | 328/37 |
| 3,898,620 | 8/1975 | Leterrier | 364/900 |
| 4,023,144 | 5/1977 | Koenig | 364/900 |
| 4,179,747 | 12/1979 | Diugos | 364/900 |
| 4,203,030 | 5/1980 | Moran | 328/37 |

*Primary Examiner*—Harvey E. Springborn
*Attorney, Agent, or Firm*—Hill, Van Santen, Steadman, Chiara & Simpson

[57] ABSTRACT

A combination of one or more shift registers with a binary counter and a memory device is disclosed wherein binary information inputs are supplied to the shift register through a plurality of AND gates which also receive inputs from a pulse generator and the output of the shift register is supplied through a second plurality of AND gates to a storage device, and wherein the binary counter supplies inputs to the second plurality of AND gates, and wherein the pulse generator supplies outputs to the shift register, the binary counter and to the first plurality of AND gates. A second embodiment provides a plurality of shift registers which receive outputs from the first shift register and are connected to a plurality of memories through additional AND gates which are controlled by the pulse generator and the associated shift register.

2 Claims, 4 Drawing Figures

COMBINATION SHIFT REGISTER, COUNTER AND MEMORY DEVICE

BACKGROUND OF THE INVENTION

1. Field of the Invention

The invention relates to a digital semiconductor circuit comprising a first circuit component which contains a chain of series connected flip-flop cells and a second circuit component which contains a further chain of series-connected flip-flop cells, wherein a sequence of clock pulses which serve to control the two circuit components is made from a pulse generator and wherein one of these two circuit components consists of a shift register and its shift pulse train is formed by the aforementioned sequence of clock pulses.

Prior Art

A circuit of this kind is described in the German AS 21 12 637 which corresponds to U.S. Pat. No. 3,631,402. This AS relates to a complex circuit arrangement comprising integrated circuits which are connected to one another, the individual features of which do not require to be mentioned for the present consideration. However, in these circuits, it is provided that the items of information which they supply are transmitted in parallel to an output shift register for series transfer to an input shift register which is assigned to the adjacent circuits, and from the latter are offered in parallel form to individual components of this circuit.

Thus, in the circuit of U.S. Pat. No. 3,631,402, the first circuit component consists of a shift register operated as a parallel-series converter, and the second circuit component consists of a further shift register which is connected as a series-parallel converter relative to the first circuit component. The major part of a shift register of this kind is usually formed by a chain of series-connected, identical flip-flop cells each having an input for the shift pulse train, and an information input and an information output which latter is connected to the information input of the particular following cell. Thus, the digital semiconductor circuit shown in U.S. Pat. No. 3,631,402 allows items of information to be transferred from one circuit component to another and in the case of complex circuits composed from individual modules the two shift registers can be arranged on separate chips.

A shift register is a circuit in which an item of information can be transported in unchanging form. This is due to the fact that the individual flip-flop cells (generally master-slave flip-flops) of the shift register are connected to one another in such a manner that with each clock pulse the item of information stored in the individual cell is transferred to the following cell so that the stored overall information is shifted by one step in the same direction. However, it is also possible to connect the cells of a flip-flop chain in another fashion, namely as a binary counter. Here again the operating state of the following cell is controlled by the preceding cell. However, the control is such that directly following a change in the operating state of a flip-flop cell which follows another cell even when the cell has assumed the prior operating state of the preceding cell, the preceding cell will generally change its operating state.

SUMMARY OF THE INVENTION

As has been recognized by the present invention, the behavior of a binary counter which differs from that of a shift register provides interesting possibilities for controlling information between various components of a digital semiconductor circuit.

Therefore, in accordance with the present invention, the digital semiconductor circuit referred to in the introduction is designed in such a manner that the other of the two circuit components is designed as a binary counter and is fed with the pulses of the shift pulse train as counting pulses; that moreover, the pulse generator is capable of periodically emitting a pulse which serves to control the information reception and/or information emission of the shift register with a frequency which is less than the frequency of the shift clock pulses, in such a manner that the shift clock pulses which occur each second are in a fixed whole-numbered ratio to the control pulses which occur each second; that moreover, the control pulses also serve as resetting pulses for the binary counter; and that finally the items of information which occur at the information output of the first circuit component serve to control the forwarding of information from the second circuit component.

In a first embodiment of the invention, the first circuit component consists of the shift register and the second circuit component consists of a binary counter. In a second embodiment, the first circuit component is constituted by the binary counter and the second circuit component by the shift register.

THE DRAWINGS

The invention will now be described in detail making reference to FIGS. 1 to 4, in which.

DESCRIPTION OF THE PREFERRED EMBODIMENTS

Figure 1:
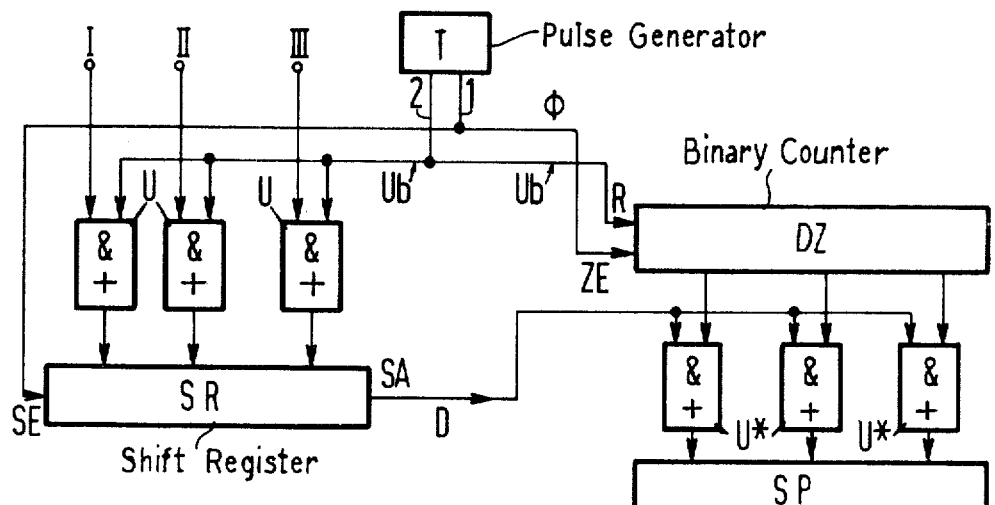
FIG. 1 illustrates a first embodiment of the invention.

In the system corresponding to the invention which is illustrated in the block circuit diagram in FIG. 1, the first circuit component comprising a flip-flop chain is formed by a shift register SR and the second circuit component is formed by a binary counter DZ. The binary counter consists, by way of example, of an asynchronous counter or, in the interests of higher switching speeds, a synchronous counter.

The items of information which are to be processed and which are in the form of digital signals occur in parallel at a plurality of information inputs I, II, III etc. of the system and are each input in a known manner and in parallel into the shift register SR via an AND-gate U assigned to the relevant signal input I, II, III, etc., as soon as the auxiliary pulse train $U_b$ which is supplied by the pulse generator T and which acts as a transfer pulse train has reached the second input of the AND-gates U. This transfer pulse train $U_b$ is simultaneously fed to the resetting input R of the binary counter DZ and therefore whenever it occurs ensures that the binary counter DZ is reset to the starting state.

The auxiliary pulse $U_b$ which thus serves as a control pulse in accordance with the above definition is emitted from the output 2 of the pulse generator T, and the shift pulse train or counting pulse train $\phi$ is emitted from the output 1 of the pulse generator T in each case at periodic intervals. Consequently, the switching mode is as follows: initially the output 2 of the pulse generator T is connected to the resetting input R of the binary counter DZ and to one of the two signal inputs of the AND-gates U, whereas the output 1—which supplies the shift clock pulses $\phi$—of the pulse generator T is connected to the counting input ZE of the binary counter DZ and to the shift pulse train input SE of the shift register SR. In the manner which is usual when a shift register is connected as a parallel-series converter, the signal output of the individual AND-gates U is connected in accordance with the given sequence to a signal input for information of the shift register SR.

The individual outputs of the binary counter DZ are each connected to an input of an AND-gate U* which possesses two inputs and which serves to forward the count contained in the counter DZ when released by the information which appears at the output of the first circuit component SR. Accordingly, the signal output SA of the first circuit component—i.e., the signal output SA for series read-out of the shift register SR—is connected to the second input of the AND-gate U*, whereas the outputs of the individual AND-gates U* are each connected to an address input of a store SP which is to be linked to the binary counter DZ, e.g., a shift register controlled by the pulse generator T. This store SP serves to forward and to analyze the count which is contained in the binary counter DZ when an appropriate control signal D is present at the output of the shift register SR which forms the first circuit component. If a ONE is present at the information output SA of the shift register SR, the count ONE is transferred from the individual outputs of the binary counter DZ as a ONE and the count ZERO is transferred as a ZERO to the store SP. In all other cases a ZERO is transferred irrespectively of whether the count at the relevant counter output corresponds to a ZERO or a ONE.

Figure 4:
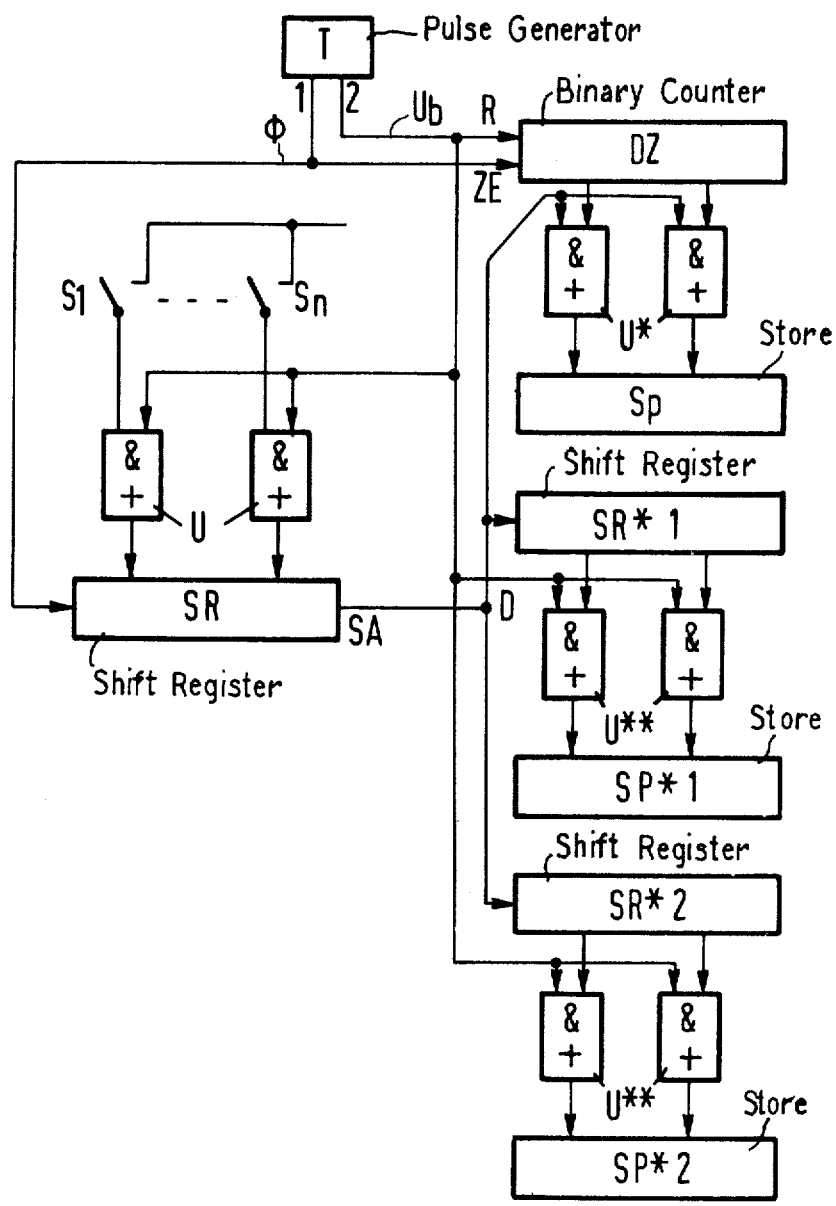
FIG. 4 illustrates the invention.

As will be shown, making reference to FIG. 4, the above described variant of the invention is of significance in the production of an electronic organ wherein switches S-$S_n$ may be actuated by the keys of an organ.

Figure 2:
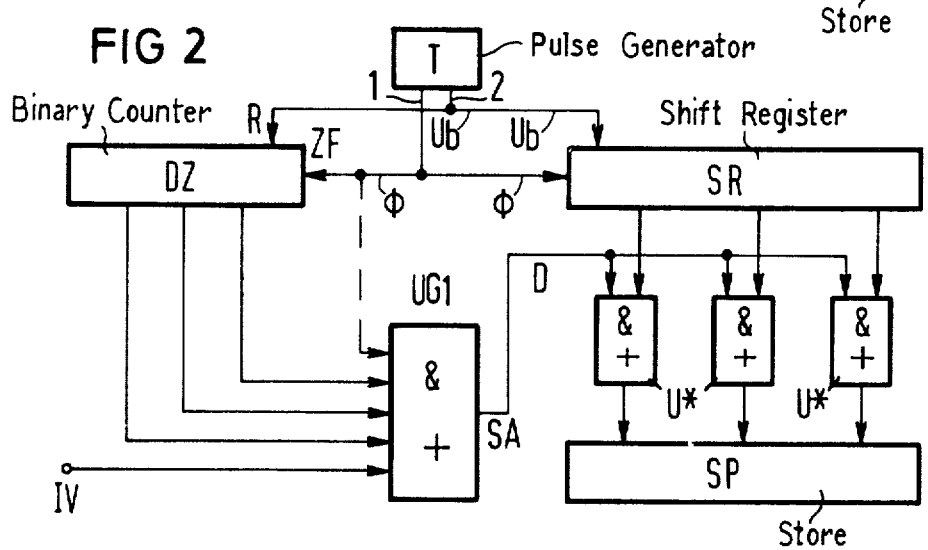
FIG. 2 illustrates a second embodiment.

A second embodiment of the invention is based on the system illustrated in FIG. 2. A binary counter DZ is provided as the first circuit component and a shift register SR is provided as the second circuit component. An AND-gate $UG_1$ is controlled by at least a part of the counter stages of the binary counter DZ and possibly also by the shift pulse train $\phi$ and by digital signals supplied via an external signal input IV. Here one input of the AND-gate $UG_1$ is in each case assigned to a controlling signal output of the binary counter DZ and to the output 1 of the shift register T and to the signal input IV. The control pulses $U_b$ which appear at the output 2 of the pulse generator T are again applied as resetting pulses to the reset input R of the binary counter DZ whereas on the other hand they serve to control the information input into the shift register SR. This can take place, for example, in the same manner as in the shift register SR of the arrangement shown in FIG. 1. However, it is also possible for the pulses $U_b$ to instigate the resetting of the shift register SR on each occasion.

The output of the AND-gate $UG_1$ (see FIG. 2) only emits a signal when all its inputs carry a logic ONE. This is the case when a logic ONE is present at those outputs of the counter stages of the binary counter which are connected to the AND-gate $UG_1$ (usually these are either the Q-outputs or the $\overline{Q}$-outputs). When a connection exists between the output 1 of the pulse generator T and the AND-gate $UG_1$ and likewise between the external signal input IV and the gate $UG_1$, here again a ONE must occur until the gate $UG_1$ responds and its output emits a signal D which controls the information output from the shift register SR.

If the formation of the information in the shift register SR is to take place in accordance with the above details by employing the signals $U_b$ to reset the shift register SR into the starting state, the signal $U_b$ brings all the cells of the shift register SR into the starting state so that on the occurrence of the pulse $U_b$ the information contained in the shift register is erased.

Figure 3:
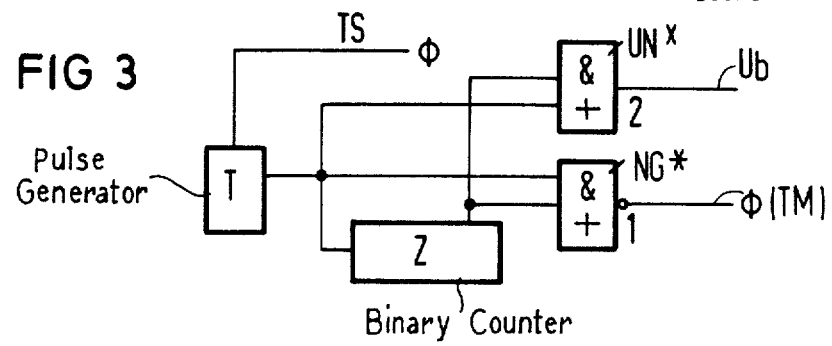
FIG. 3 illustrates an arrangement for producing the auxiliary pulses by means of a pulse generator which supplies the shift pulse trains.

The pulse generator T illustrated in FIG. 3 is designed in such a manner that in addition to the pulses TM and TS which are required to control the flip-flop chains in the binary counter DZ and in the shift register SR, the control pulses $U_b$ also occur. For this purpose, a pulse generator T is required which is capable of supplying two corresponding pulse sequences, e.g., TS and a further sequence of pulses. The sequence TS can then be directly used as the TS pulse train for the shift register. That output of the pulse generator T which supplies the other pulse sequence is firstly connected to the counting input of a binary counter Z, secondly to one input of a NAND-gate NG*, and thirdly to one input of an AND-gate UG*. In addition, a selected output of the counter Z is connected both to the other input of the NAND-gate NG* and to the other input of the AND-gate UG*. The signal output of the NAND-gate NG* then supplies the second sequence TM of clock pulses and the signal output of the AND-gate UG* supplies the sequence of control pulses $U_b$. Thus, the output of the AND-gate UG* represents the output 2, and the output of the NAND-gate NG* and the output of the pulse generator T which supplies the signal TS commonly represent the output 1.

German patent application P 27 13 319.3 (VPA 77 P 1027) describes an electronic pulse generator which is suitable both to emit pulses TS and TM and to emit pulses $U_b$, and which is particularly recommended for use in the present case as it avoids disturbing superimpositions which can easily occur on account of transit time differences.

In connection with FIG. 4 which is now to be described, the following facts relating to the construction of electronic organs will first be described. In an organ of this kind, a plurality of keys, e.g., manuals comprising 61 keys and a pedal comprising 31 keys and a plurality of programming switches must be provided which must be able to be used at all times and independently of one another. Facilities are also to be provided for finding out the first and/or last key being played between successive scannings of the manual, and for further groupings of the items of information formed by the actuation of the individual keys, which groupings can possibly depend upon the particular depressed keys in particular in programmable fashion.

The system illustrated in the block circuit diagram in FIG. 4 satisfies these requirements. The switches $S_1$-$S_n$ are operated by the various keys of the organ. As already mentioned above, it is based on a first embodiment of the invention and incorporates the design shown in FIG. 1.

Accordingly, the signal inputs I, II, III, . . . etc., are each connected by means of a switch $S_1$, $S_2$, . . . $S_n$ which is to be closed by the key which is played or another means to supply a continuous signal which disappears when the relevant switch is opened. The signal assigned to the particular actuated switch is applied to the input of an AND-gate U which is provided in the manner shown in FIG. 1 for connection to the individual information inputs of the shift register SR which constitutes the first circuit component. The control of the binary counter DZ and of the store SP assigned to the latter likewise takes place in the manner shown in FIG. 1.

However, the signal D supplied from the shift register SR is not only applied to the counting input of the binary counter DZ provided as the second circuit component as in the case of the arrangement shown in FIG. 1, but is also applied to the information inputs of further shift registers SR*$_1$, SR*$_2$, etc. These further shift registers are in turn connected by a number of AND-gates U** corresponding to the shift register SR in FIG. 2 to the address inputs of an assigned store SP*$_1$, SP*$_2$, etc. However, the second inputs of these AND-gates U** are not controlled by the signal D supplied by the shift register SR as in the case of the AND-gates U*, but by the control pulses U$_b$ which are supplied from the output 2 of the pulse generator T.

Thus, the behavior pattern is as follows: the operating states of the individual switches S$_1$, S$_2$, ... S$_n$ are interrogated by the signal U$_b$ which, for example, for use in an electronic organ, is provided with a duration of 10 μs. Via the AND-gates U the information relating to each switch (i.e., organ key) is input into a cell of the shift register SR. The pulse U$_b$ which serves to call up the keyboard information in parallel from the arrangement of the switches S$_1$, S$_2$, etc., and the following shift pulse trains φ are emitted to the shift register SR by means of the pulse generator T and a central control unit (not shown). In addition, by means of the shift clock pulses φ the information is read out in serial fashion from the shift register SR and offered both to the binary counter DZ and to the shift registers SR*$_1$, SR*$_2$, etc. Here it is irrelevant whether the shift register SR and the other shift registers are arranged on a common semiconductor chip since, as can be easily gathered, the control functions in both cases using a system corresponding to the invention.

The shift registers SR*$_1$, SR*$_2$, etc., receive the information supplied by the shift register SR. With the next auxiliary pulse U$_b$ the information contained in the shift registers SR*$_1$, SR*$_2$, etc., is transferred in parallel into the stores SP*$_1$, SP*$_2$, etc., and the series of switches S$_1$, S$_2$, ... S$_n$ are re-interrogated. The binary counter DZ is reset to the starting position with each pulse U$_b$. This binary counter counts all of the shift pulse φ. If a closed switch S$_1$, S$_2$, ... S$_n$ is simultaneously reported from the shift register SR, the associated count of the binary counter DZ can be stored.

It will be apparent to those skilled in the art that many modifications and variations may be effected without departing from the spirit and scope of the novel concepts of the present invention.

We claim as our invention:

1. A digital semiconductor circuit which receives input signals (I, II, III . . . ) for charging a respective memory cell of a clock-controlled shift register (SR) operating in parallel to serial operation, comprising a clock generator (T) producing first and second clock output signals (1, 2), a shift register (SR), a binary digital counter (DZ), said shift register (SR) and said binary counter (DZ) receiving said first clock output signal (1), a plurality of AND gates (U*) receiving the outputs of respective counting stages of said digital counter (DZ), the serial output of said shift register (SR) connected to inputs of all of said AND gates (U*), an address memory (SP) receiving the outputs of said plurality of AND gates (U*) which are connected to the respective memory cell of said address memory (SP) which is designed as a shift register, a second plurality of AND gates (U) receiving a second output of said clock generator (T) as well as said input signals (I, II, III . . . ) and the output of said second plurality of AND gates connected to said shift register and said second output (2) connected as the reset pulse of said binary digital counter (DZ) and said first and second outputs (1, 2) of said clock generator (T) synchronized such that reset of said binary counter occurs only after the complete emptying of said shift register (SR).

2. A digital semiconductor circuit according to claim 1, including at least one further shift register (SR*1, SR*2) which are connected to outputs of said shift register (SR) and said clock generator (T), said further shift registers (SR*1, SR*2) connected through a third plurality of AND gates (U**) driven by the second output (2) of said clock generator (T) and at least one further storage device (SP*1, SP*2) connected to said third plurality of AND gates (U**) for further processing the signal (D) obtained from said first shift register (SR).

* * * * *